United States Patent
Iwamoto (10) Patent No.: US 9,917,552 B2
(45) Date of Patent: Mar. 13, 2018

(54) OFFSET CORRECTION CIRCUIT AND TRANSCONDUCTANCE PROPORTIONAL CURRENT GENERATION CIRCUIT

(71) Applicant: FUJI ELECTRIC CO., LTD., Kawasaki-shi, Kanagawa (JP)

(72) Inventor: Motomitsu Iwamoto, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/448,580

(22) Filed: Mar. 2, 2017

(65) Prior Publication Data
US 2017/0272038 A1 Sep. 21, 2017

(30) Foreign Application Priority Data
Mar. 17, 2016 (JP) ................. 2016-053539

(51) Int. Cl.
*H03F 3/45* (2006.01)
*H03F 1/30* (2006.01)

(52) U.S. Cl.
CPC .......... *H03F 1/301* (2013.01); *H03F 3/4521* (2013.01); *H03F 2203/45212* (2013.01); *H03F 2203/45286* (2013.01); *H03F 2203/45288* (2013.01)

(58) Field of Classification Search
CPC ....................................................... H03F 3/45
USPC ..................... 330/296, 261, 285, 9
See application file for complete search history.

(56) References Cited

U.S. PATENT DOCUMENTS

| 4,423,385 A * | 12/1983 | Evans | H03F 3/45376 330/253 |
| 7,382,183 B2 * | 6/2008 | Nolan | H03F 3/45986 330/69 |
| 2004/0178846 A1 * | 9/2004 | Kuyel | H03F 3/45192 330/9 |

FOREIGN PATENT DOCUMENTS

JP H05-291845 A 11/1993

* cited by examiner

Primary Examiner — Henry Choe
(74) Attorney, Agent, or Firm — Rabin & Berdo, P.C.

(57) ABSTRACT

A first amplifier circuit includes differential pair transistors that amplify a difference between input voltages and active load transistors connected to the differential pair transistors. A second amplifier circuit amplifies output voltage of the first amplifier circuit. An offset correction current source is connected in parallel with the active load transistors and adjusts electric current flowing through the differential pair transistors correct offset voltage. An offset correction switch switches a driving state of the offset correction current source. A transconductance proportional current generation circuit generates transconductance proportional current for compensating for temperature drift of offset correction voltage for correcting the offset voltage. The transconductance proportional current is proportional to transconductance.

8 Claims, 10 Drawing Sheets

FIG. 10

OFFSET CORRECTION CIRCUIT AND TRANSCONDUCTANCE PROPORTIONAL CURRENT GENERATION CIRCUIT

CROSS-REFERENCE TO RELATED APPLICATION

This application is based upon and claims the benefit of priority of the prior Japanese Patent Application No. 2016-053539, filed on Mar. 17, 2016, the entire contents of which are incorporated herein by reference.

BACKGROUND OF THE INVENTION

1. Field of the Invention

The embodiments discussed herein relate to an offset correction circuit and a transconductance proportional current generation circuit.

2. Background of the Related Art

In a differential amplifier circuit, imbalance is usually generated in electric current that flows in the circuit, due to mismatch of characteristics of differential pair transistors and characteristics of active loads connected to the differential pair transistors, and this electric current imbalance results in generation of offset voltage. When the offset voltage is high, the offset voltage becomes an error factor and sometimes affects circuit operation, and therefore the offset voltage is corrected.

As a past technology, there is a proposed technology which utilizes metal-oxide-semiconductor field-effect transistors (MOSFETs) that operate as a differential input pair and a constant current source having a negative temperature coefficient for supplying constant current to the MOSFETs, thereby reducing temperature drift of the offset voltage.

See, for example, Japanese Laid-open Patent Publication No. 5-291845.

In the differential amplifier circuit of the past, an offset voltage correction current source is located to generate offset correction voltage on the basis of a current value that flows in the current source, in order to correct the offset voltage.

However, the offset correction voltage is dependent on temperature and thus changes as the temperature changes, making it difficult to correct the offset voltage highly accurately.

SUMMARY OF THE INVENTION

According to one aspect, there is provided an offset correction circuit including: an operational amplifier circuit that includes a first amplifier circuit that includes differential pair transistors for amplifying a difference between input voltages and active load transistors connected to the differential pair transistors, and a second amplifier circuit that amplifies output voltage of the first amplifier circuit; an offset correction current source that is connected in parallel with the active load transistors and adjusts electric current flowing through the differential pair transistors to correct offset voltage; an offset correction switch that switches a driving state of the offset correction current source; and a transconductance proportional current generation circuit that generates transconductance proportional current for compensating for temperature drift of offset correction voltage for correcting the offset voltage, the transconductance proportional current being proportional to transconductance.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

In the following, embodiments will be described with reference to the drawings.

Figure 1A:
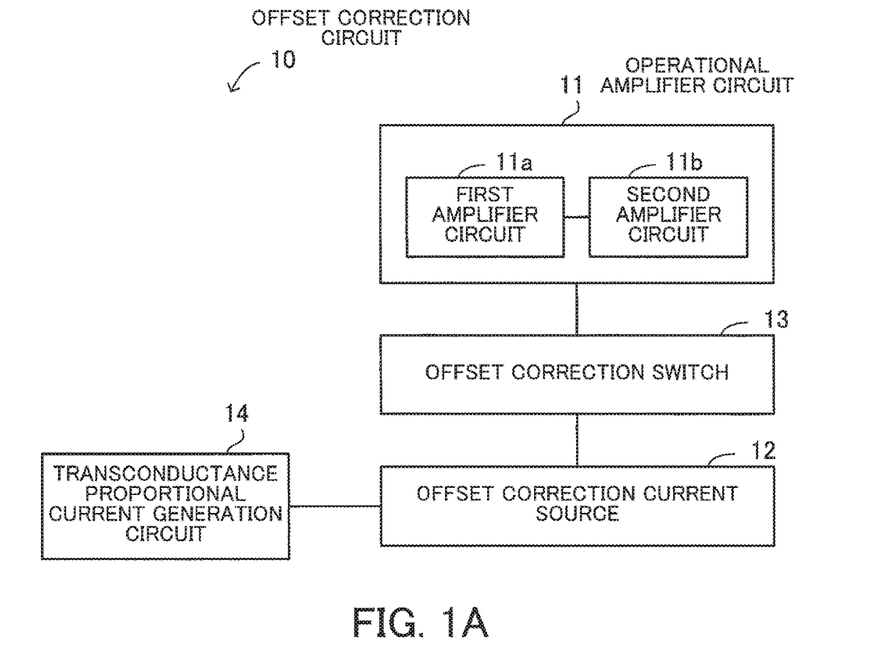
FIG. 1A illustrates one example of a configuration of an offset correction circuit.

FIG. 1A illustrates one example of a configuration of an offset correction circuit. The offset correction circuit 10 includes an operational amplifier circuit 11, an offset correction current source 12, an offset correction switch 13, and a transconductance proportional current generation circuit 14.

The operational amplifier circuit 11 includes a first amplifier circuit 11a and a second amplifier circuit 11b. The first amplifier circuit 11a includes differential pair transistors that amplify a difference between input voltages, and active load transistors connected to the differential pair transistors. The second amplifier circuit 11b amplifies an output voltage of the first amplifier circuit 11a.

The offset correction current source 12 is connected in parallel with the active load transistors, and adjusts electric current that flows through the differential pair transistors in order to correct offset voltage. The offset correction switch 13 switches a driving state of the offset correction current source 12.

The transconductance proportional current generation circuit 14 generates transconductance proportional current that is proportional to transconductance and serves to compensate for temperature drift of offset correction voltage for correcting the offset voltage.

Figure 1B:
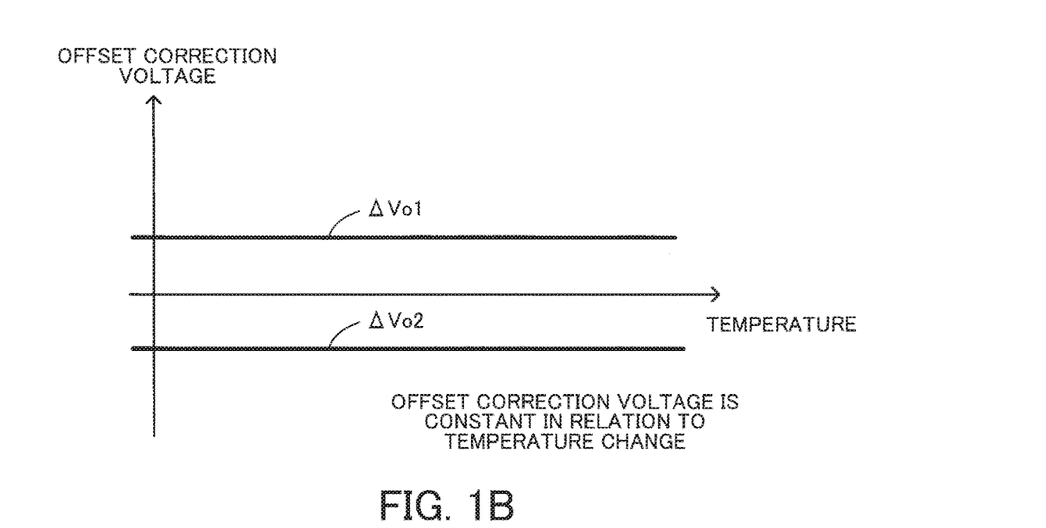
FIG. 1B illustrates a relationship between offset correction voltage and temperature.

FIG. 1B illustrates a relationship between the offset correction voltage and temperature. The vertical axis represents the offset correction voltage, and the horizontal axis represents temperature. The offset correction circuit 10 generates offset correction voltage that does not include a temperature-dependent parameter, by generating the electric current of the offset correction current source 12 by means of the transconductance proportional current generation circuit 14.

Hence, the offset correction voltage ΔVo1 does not change but becomes flat as the temperature changes, when the electric current (transconductance proportional current) adjusted by the offset correction current source 12 is positive.

In the same way, the offset correction voltage ΔVo2 does not change but becomes flat as the temperature changes, when the electric current adjusted by the offset correction current source 12 is negative. As described above, temperature drift is prevented, and thus the offset voltage is corrected highly accurately.

Next, a problem to be solved will be described with reference to FIGS. 2 and 3, before the technology of the present embodiment is described in detail. First, how the offset voltage is generated will be described by using a voltage follower that operates to make an input voltage and an output voltage equal to each other.

Figure 2:
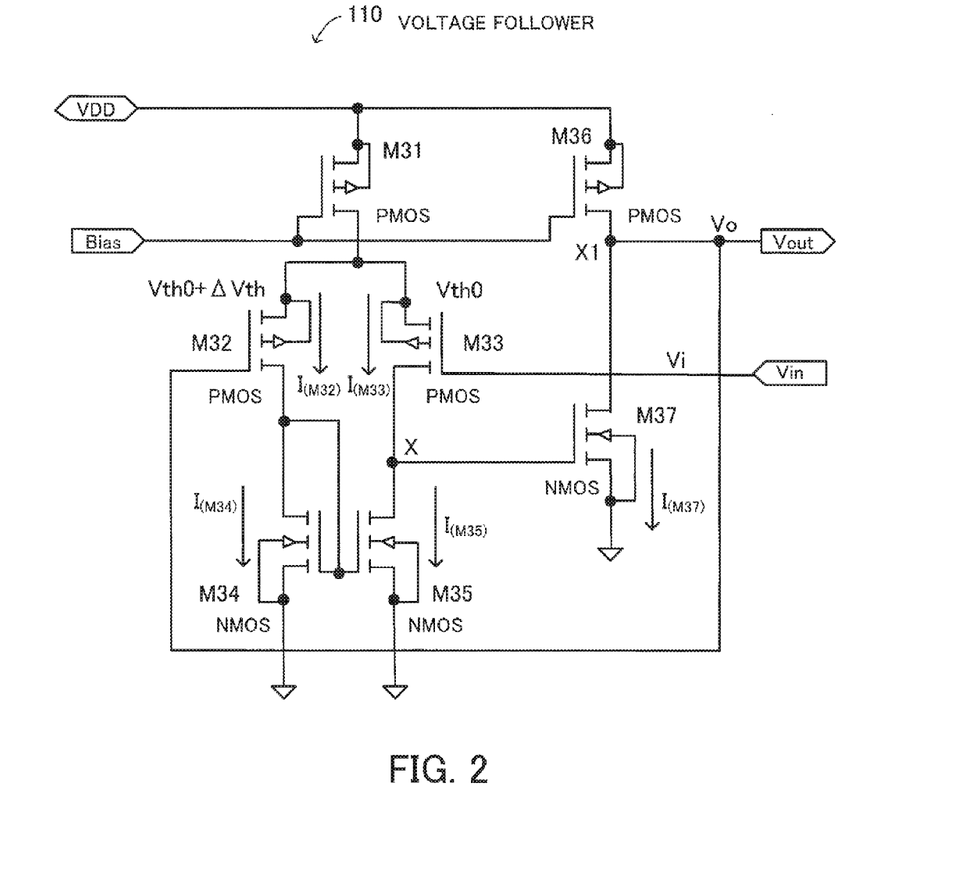
FIG. 2 illustrates one example of a configuration of a voltage follower.

FIG. 2 illustrates one example of a configuration of the voltage follower. The voltage follower 110 includes P-channel metal-oxide semiconductor (PMOS) transistors M31 to M33 and M36 and N-channel MOS (NMOS) transistors M34, M35, and M37.

In the connection relationship of the circuit elements, a power supply terminal VDD is connected to a source of the PMOS transistor M31 and a source of the PMOS transistor M36. A bias terminal Bias is connected to a gate of the PMOS transistor M31 and a gate of the PMOS transistor M36.

A drain of the PMOS transistor M31 is connected to a source of the PMOS transistor M32 and a source of the PMOS transistor M33. An input terminal Vin is connected to a gate of the PMOS transistor M33.

An output terminal Vout is connected to a drain of the PMOS transistor M36, a drain of the NMOS transistor M37, and a gate of the PMOS transistor M32. A drain of the PMOS transistor M32 is connected to a drain of the NMOS transistor M34, a gate of the NMOS transistor M34, and a gate of the NMOS transistor M35.

A drain of the PMOS transistor M33 is connected to a drain of the NMOS transistor M35 and a gate of the NMOS transistor M37. The sources of the NMOS transistors M34, M35, and M37 are connected to a ground (hereinafter, represented by GND).

Next, the offset voltage will be described. The offset voltage is generated due to current driving ability imbalance between differential pair transistors. Also, in a saturation region, the electric currents (drain currents) Id flowing through the transistors are calculated by the following equation (1).

$$Id = (1/2) \cdot \mu \cdot Cox \cdot (W/L) \cdot (Vgs - Vth)^2 \quad (1)$$

μ is electron mobility in semiconductor; Cox is gate oxide film capacitance per unit area; W/L is aspect ratio; Vgs is gate-source voltage; and Vth is threshold voltage. Note that W is gate width (channel width), and L is gate length (channel length).

As in equation (1), the transistor current calculation equation includes a plurality of parameters, and thus the flowing electric currents are different from each other when any of the parameters is different, so as to generate offset voltage. Note that, of these parameters, the difference between the threshold voltages (gate-source voltages at which the drain currents start flowing) has a large influence on offset voltage generation factor.

When the differential pair transistors differ in threshold voltage, the electric currents flowing through the transistors differ, and thus imbalance is generated between the current driving abilities, so as to generate offset voltage.

Next, an offset voltage generation process in the voltage follower 110 will be described. A difference in threshold voltage is assumed to be exist between the PMOS transistors M32 and M33 that compose the differential pair of the voltage follower 110, due to production variation.

In this example, the threshold voltage of the PMOS transistor M33 is Vth0, and the threshold voltage of the PMOS transistor M32 is Vth0+ΔVth. Also, the gate voltage (Vi) of the PMOS transistor M33 and the output voltage Vo are assumed to be equal to each other.

Here, overdrive voltage of the PMOS transistor M33 is $Vov_{(M33)}$, and overdrive voltage of the PMOS transistor M32 is $Vov_{(M32)}$. In this case, $|Vov_{(M33)}| > |Vov_{(M32)}|$. Note that the overdrive voltage Vov is equal to Vgs-Vth.

Because $|Vov_{(M33)}| > |Vov_{(M32)}|$, the relationship between the electric current $I_{(M32)}$ flowing through the PMOS transistor M32 and the electric current $I_{(M33)}$ flowing through the PMOS transistor M33 is $I_{(M33)} > I_{(M32)}$.

On the other hand, the NMOS transistor M34 connected to the PMOS transistor M32 in a cascaded manner includes diode connection (connection between drain and gate), and therefore the electric current $I_{(M32)}$ flowing through the PMOS transistor M32 also flows through the NMOS transistor M34.

That is, the electric current $I_{(M32)}$ flowing through the PMOS transistor M32 is equal to the electric current $I_{(M34)}$ flowing through the NMOS transistor M34 ($I_{(M32)} = I_{(M34)}$).

Also, the gates of the NMOS transistors M34 and M35 have the same electric potentials, and the sources of the NMOS transistors M34 and M35 have the same electric potentials, and thus both of the NMOS transistors M34 and M35 have the same gate-source voltages Vgs, so that equal electric currents flow through the NMOS transistors M34 and M35.

That is, the electric current $I_{(M34)}$ flowing through the NMOS transistor M34 is equal to the electric current $I_{(M35)}$ flowing through the NMOS transistor M35 ($I_{(M34)} = I_{(M35)}$), establishing, $I_{(M32)} = I_{(M34)} = I_{(M35)}$. Because $I_{(M33)} > I_{(M32)}$, $I_{(M33)} > I_{(M35)}$ is established.

Thus, the electric current flowing into a node X in FIG. 2 is larger than the electric current flowing out of the node X, and thus the voltage of the node X rises. When the voltage of the node X rises, the gate voltage of the NMOS transistor M37 rises, and thus the electric current $I_{(M37)}$ flowing through the NMOS transistor M37 increases.

Also, the PMOS transistor M36 operates as a constant current source. Hence, as the electric current $I_{(M37)}$ flowing through the NMOS transistor M37 increases, the electric current flowing out of a node X1 connected to the output terminal Vout becomes larger than the electric current flowing into the node X1. Thereby, the output voltage Vo from the output terminal Vout decreases.

As the output voltage Vo decreases, the gate voltage of the PMOS transistor M32 decreases, so that the electric current $I_{(M32)}$ flowing through the PMOS transistor M32 increases. When the electric current $I_{(M32)}$ increases to establish $I_{(M32)} = I_{(M33)}$, the summation of incoming current and outgoing current at the node X becomes 0, and the electric potential becomes stable.

In this case, the overdrive voltage $Vov_{(M32)}$ of the PMOS transistor M32 is equal to the overdrive voltage $Vov_{(M33)}$ of the PMOS transistor M33, and the threshold voltage of the PMOS transistor M32 is larger than the threshold voltage of the PMOS transistor M33 by ΔVth.

Hence, the gate voltage (Vo) of the PMOS transistor M32 becomes lower than the input voltage Vi by ΔVth, generating negative offset voltage.

As described above, the offset voltage is generated in the operational amplifier circuit used in the voltage follower, the amplifier circuit, and the like. Hence, it is desirable to reduce the offset voltage to reduce the error of the output voltage.

Next, an offset correction circuit to which current sources for correcting offset voltage are connected will be described. The offset correction circuit is generally configured such that current sources are connected in parallel with active loads in order to correct the offset voltage.

Figure 3:
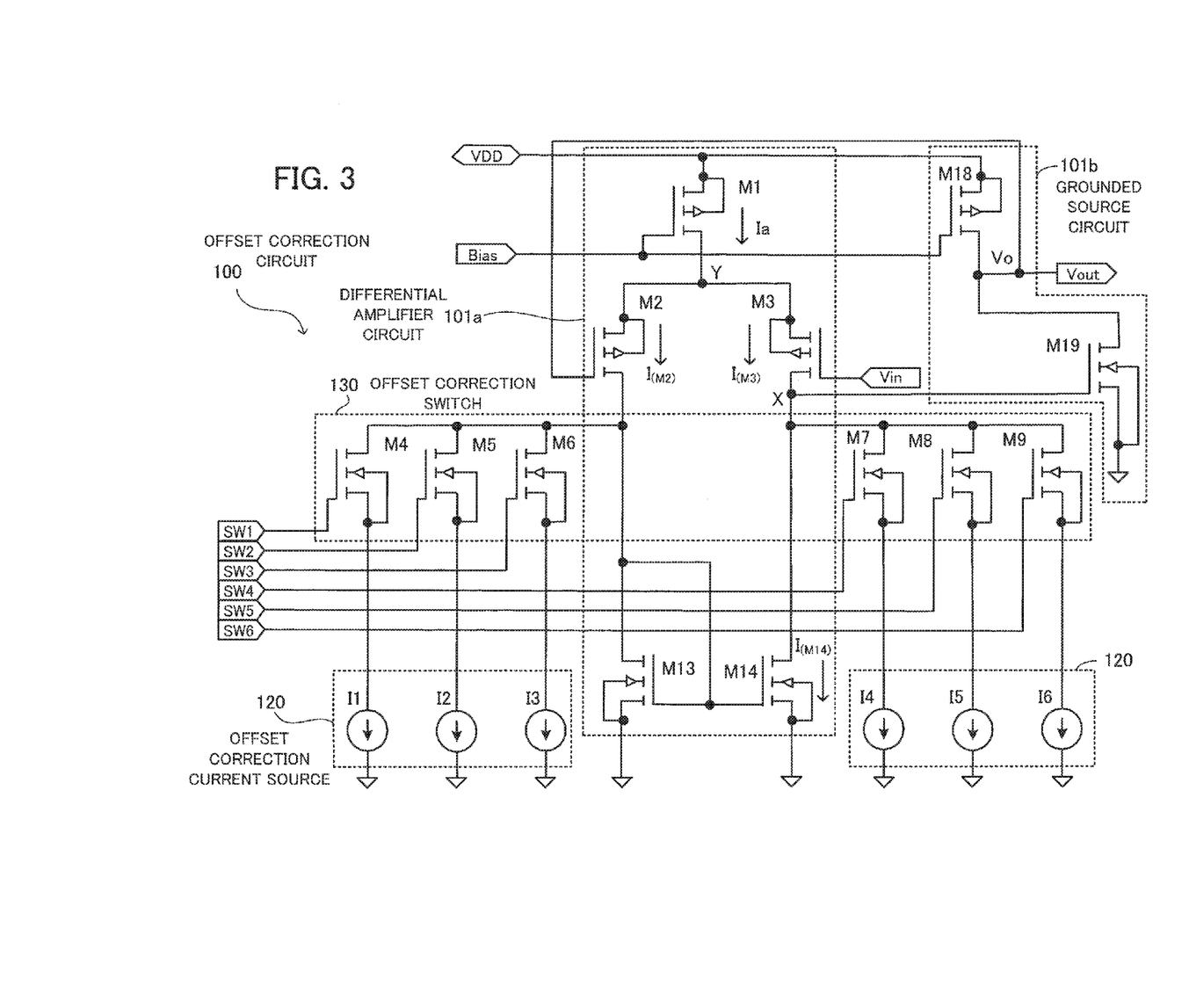
FIG. 3 illustrates one example of a configuration of an offset correction circuit.

FIG. 3 illustrates one example of a configuration of the offset correction circuit. The offset correction circuit 100 has a circuit configuration for correcting the offset voltage in a voltage follower. The offset correction circuit 100 has a 2-stage circuit (2-stage amplification) including a differential amplifier circuit 101a of input stage, and a grounded source circuit 101b of output stage, and further includes an offset correction switch 130 for selecting a current source to be driven and an offset correction current source 120.

The differential amplifier circuit 101a includes PMOS transistors M1 to M3 and NMOS transistors M13 and M14. The grounded source circuit 101b includes a PMOS transistor M18 and an NMOS transistor M19.

The offset correction switch 130 includes NMOS transistors M4 to M9, and the offset correction current source 120 includes current sources I1 to I6.

In the connection relationship of the circuit elements, a power supply terminal VDD is connected to a source of the PMOS transistor M1 and a source of the PMOS transistor M18. A bias terminal Bias is connected to a gate of the PMOS transistor M1 and a gate of the PMOS transistor M18.

A drain of the PMOS transistor M1 is connected to a source of the PMOS transistor M2 and a source of the PMOS transistor M3. An input terminal Vin is connected to a gate of the PMOS transistor M3.

An output terminal Vout is connected to a drain of the PMOS transistor M18, a drain of the NMOS transistor M19, and a gate of the PMOS transistor M2, and a source of the NMOS transistor M19 is connected to a GND.

A drain of the PMOS transistor M2 is connected to a drain of the NMOS transistor M13, a gate of the NMOS transistor M13, a gate of the NMOS transistor M14, and respective drains of the NMOS transistors M4 to M6.

A drain of the PMOS transistor M3 is connected to a drain of the NMOS transistor M14, a gate of the NMOS transistor M19, and respective drains of the NMOS transistors M7 to M9. Sources of the transistors M13 and M14 are connected to the GND.

An input terminal of the current source I1 is connected to a source of the NMOS transistor M4, and an input terminal of the current source I2 is connected to a source of the NMOS transistor M5, and an input terminal of the current source I3 is connected to a source of the NMOS transistor M6.

An input terminal of the current source I4 is connected to a source of the NMOS transistor M7, and an input terminal of the current source I5 is connected to a source of the NMOS transistor M8, and an input terminal of the current source I6 is connected to a source of the NMOS transistor M9.

The switch terminals SW1 to SW3 are connected to gates of the NMOS transistors M4 to M6 respectively, and the switch terminals SW4 to SW6 are connected to gates of the NMOS transistors M7 to M9 respectively. Output terminals of the current sources I1 to I6 are connected to the GND.

Here, an offset voltage generation process in the offset correction circuit 100 will be described briefly. If there is a characteristic mismatch between the left and right PMOS transistors M2 and M3 that compose a differential pair, imbalance is generated between the electric current $I_{(M2)}$ flowing through the PMOS transistor M2 and the electric current $I_{(M3)}$ flowing through the PMOS transistor M3.

On the other hand, the active load NMOS transistors M13 and M14 have a common gate-source voltage Vgs, and thereby the same electric currents flow through the NMOS transistors M13 and M14.

Thereby, the output voltage from the output terminal Vout changes, and the output voltage is fed back to the differential pair PMOS transistors M2 and M3, and the voltages applied to the differential pair PMOS transistors M2 and M3 become different from each other in such a manner to cancel the imbalance between the electric current $I_{(M2)}$ and the electric current $I_{(M3)}$.

Then, the circuit system becomes stable when the imbalance between the electric current $I_{(M2)}$ and the electric current $I_{(M3)}$ is cancelled. In this case, the difference between the voltages applied to the differential pair PMOS transistors M2 and M3 is the offset voltage.

Note that, when there is a characteristic mismatch between the active load NMOS transistors M13 and M14, imbalance is generated between the electric currents flowing through the NMOS transistors M13 and M14, so as to generate offset voltage in the same way.

Despite the offset voltage generated in this process, the offset correction circuit 100 illustrated in FIG. 3 includes the offset correction switch 130 and the offset correction current source 120 in order to correct, from outside, the electric current imbalance which is a generation factor of the offset voltage.

The offset correction switch 130 and the offset correction current source 120 are configured such that a plurality of current sources are located in parallel with the active load NMOS transistors M13 and M14 connected to the GND side of the differential pair PMOS transistors M2 and M3.

In this example, the current sources I1 to I6 are located with three current sources on the left side and three current sources on the right side, and are configured such that electric current driving of the current sources I1 to I6 is switched by switching of the NMOS transistors M4 to M9.

For example, when a high-level signal is input into the switch terminal SW1, the NMOS transistor M4 is turned on, and a predetermined electric current flows from the current source I1 connected to the NMOS transistor M4. Also, when a low-level signal is input into the switch terminal SW1, the NMOS transistor M4 is turned off, and electric current driving of the current source I1 stops. The same thing can be said to other elements.

When the offset voltage is negative and the output voltage to be increased, the current sources I4 to I6 positioned at the right side, which are close to the non-diode-connected NMOS transistor M14 among the active load NMOS transistors M13 and M14, are driven.

Conversely, when the offset voltage is positive and the output voltage is to be reduced, the current sources I1 to I3 positioned at the left side, which are close to the diode-connected NMOS transistor M13 among the NMOS transistors M13 and M14, are driven.

In the following, offset voltage correction performed when the offset voltage is negative and the output voltage is to be increased will be described. Note that a high-level signal is input from the switch terminal SW4 to turn on the NMOS transistor M7 and to drive the current source I4 only, and that the current value of the current source I4 is ΔI.

By driving the current source I4, the voltage of the node X illustrated in FIG. 3, at which the summation of incoming current and outgoing current has been 0, decreases, and the output voltage Vo (the gate voltage of the PMOS transistor M2) rises. As the gate voltage of the PMOS transistor M2 rises, the drain current of the PMOS transistor M2 decreases.

In this case, the total electric current flowing through the PMOS transistors M2 and M3 is constant at the electric current Ia supplied from the PMOS transistor M1, and thus the decreasing amount of the electric current $I_{(M2)}$ of the PMOS transistor M2 is equal to the increasing amount of the drain current $I_{(M3)}$ of the PMOS transistor M3.

Also, considering that the electric current $I_{(M3)}$ of the PMOS transistor M3 increases as the gate-source voltage Vgs of the PMOS transistor M3 becomes higher, and that the gate voltage of the PMOS transistor M3 is fixed, the voltage of the node Y, which is the source of the PMOS transistor M3, rises to increase the electric current $I_{(M3)}$ of the PMOS transistor M3.

Here, the transconductances of the PMOS transistors M2 and M3 are equal to each other and are represented by gmd. Note that transconductance means a change rate of drain current relative to change of gate-source voltage (gmd=ΔI/ΔVgs).

Also, the rising amount of the gate voltage of the PMOS transistor M2 (the rising amount of the output voltage Vo) is represented by ΔVo, and the voltage rising amount of the node Y is represented by ΔVy.

In this case, the electric current increasing amount $\Delta I_{(M2)}$ of the electric current $I_{(M2)}$ of the PMOS transistor M2 is expressed by following equation (2a), and the electric current increasing amount $\Delta I_{(M3)}$ of the electric current $I_{(M3)}$ of the PMOS transistor M3 is expressed by following equation (2b).

$$\Delta I_{(M2)} = gmd \times \Delta Vy - gmd \times \Delta Vo \quad (2a)$$

$$\Delta I_{(M3)} = gmd \times \Delta Vy \quad (2b)$$

Also, $\Delta I_{(M2)}$ and $\Delta I_{(M3)}$ are 0 in total, and therefore (gmd×ΔVy−gmd×ΔVo)+(gmd×ΔVy)=0 is established, and thus ΔVy is expressed by equation (3).

$$\Delta Vy = \Delta Vo/2 \quad (3)$$

Thus, when the equation (3) is incorporated into the equations (2a) and (2b), $\Delta I_{(M2)}$ and $\Delta I_{(M3)}$ are expressed by following equations (4a) and (4b). Note that $\Delta I_{(M2)}$ of the equation (4a) is negative, and thus decreasing is expected.

$$\Delta I_{(M2)} = gmd \times \Delta Vy - gmd \times \Delta Vo = gmd \times \Delta Vo/2 - gmd \times \Delta Vo = -gmd \times \Delta Vo/2 \quad (4a)$$

$$\Delta I_{(M3)} = gmd \times \Delta Vy = gmd \times \Delta Vo/2 \quad (4b)$$

Thus, the electric current $I_{(M2)}$ flowing through the PMOS transistor M2 is expressed by following equation (5a), and the electric current $I_{(M3)}$ flowing through the PMOS transistor M3 is expressed by following equation (5b).

$$I_{(M2)} = Ia - gmd \times \Delta Vo/2 \quad (5a)$$

$$I_{(M3)} = Ia + gmd \times \Delta Vo/2 \quad (5b)$$

On the other hand, $I_{(M2)} = I_{(M13)} = I_{(M14)}$ is established, and therefore the electric current of Ia−gmd×ΔVo/2 flows through the NMOS transistor M14. Thus, when the Kirchhoff's electric current law is applied to the node X (where flowing-in direction is +), following equation (6) is established.

$$Ia + gmd \times \Delta Vo/2 - (Ia - gmd \times \Delta Vo/2) - \Delta I = 0 \quad (6)$$

The offset correction voltage ΔVo is expressed by following equation (7) which is transformed from equation (6).

$$\Delta Vo = \Delta I/gmd \quad (7)$$

Note that gmd is the transconductances of the differential pair transistors (PMOS transistors M2 and M3), and ΔI is the current value of the offset correction current source (in this example, the current value of the current source I4). Here, the transconductance gm is generally expressed by the following equation (8).

$$gm = \sqrt{2 \cdot \mu \cdot Cox \cdot \frac{W}{L} \cdot I} \quad (8)$$

μ is mobility of an electron in the semiconductor; Cox is gate oxide film capacitance per unit area; W/L is aspect ratio; and I is drain current. Note that W is gate width (channel width), and L is gate length (channel length).

Thus, the offset correction voltage ΔVo is expressed by following equation (9).

$$\Delta Vo = \frac{\Delta I}{gm} \quad (9)$$

$$= \frac{\Delta I}{\sqrt{2 \cdot \mu \cdot Cox \cdot \frac{W}{L} \cdot I}}$$

As in the equation (9), the offset correction voltage ΔVo can be controlled by the electric current amount ΔI of the current source connected to the active load transistors. Thus, as illustrated in FIG. 3, a plurality of current sources are connected to both sides of the active loads in order to adjust electric current amount by switching, and for example a combination of switching on and off is decided to set the offset voltage at minimum at the time of shipment from a plant.

Next, above-mentioned Japanese Laid-open Patent Publication No. 5-291845 will be described. According to Japanese Laid-open Patent Publication No. 5-291845, electric current flowing through a differential pair has negative temperature characteristics (characteristics in which flowing electric current decreases as temperature becomes higher) to compensate for temperature drift of the offset voltage. This is based on the following principle.

The offset voltage $V_{IO}$ of the operational amplifier including the differential pair composed of MOSFETs is expressed by following equation (10).

$$V_{IO} = V_{GS1} - V_{GS2} \quad (10)$$

$$= \frac{I_1}{g_{m1}} - \frac{I_2}{g_{m2}}$$

$$= \frac{I_1}{g_{m1}}\left(1 - \frac{g_{m1}}{g_{m2}} \cdot \frac{I_2}{I_1}\right)$$

-continued $$= \sqrt{\frac{I_1}{2 \cdot \mu \cdot Cox \cdot \frac{W_1}{L_1}}} \left(1 - \frac{g_{m1}}{g_{m2}} \cdot \frac{I_2}{I_1}\right)$$

In equation (10), the numerator and the denominator of the second term in the parentheses (($g_{m1}/g_{m2}$)×($I_2/I_1$)) are expected to have the same temperature characteristics, and therefore the temperature characteristics are considered to be canceled as a whole.

Thus, temperature-dependent parameters of equation (10) are $I_1$ and $\mu$ in the root. The mobility $\mu$ has negative temperature characteristics, and thus it is possible to cancel the temperature characteristics of the offset voltage by setting the negative temperature characteristics in the electric current $I_1$, that is, the current value of the current source that supplies the electric current to the differential pair.

Next, a problem will be described. The offset correction voltage ΔVo in the offset correction circuit 100 illustrated in FIG. 3 in which the current sources are connected in parallel with the active loads is expressed by equation (9) as described above.

In this calculation equation of the offset correction voltage ΔVo, ΔI is the current value of the offset correction current source; I is the electric current flowing through the differential pair MOS; and $\mu$ is the mobility of the differential pair MOS.

There is a problem that, even if ΔI and I are made temperature-independent, the mobility $\mu$ has temperature-dependent characteristics, and thus the offset correction voltage ΔVo has temperature-dependent characteristics, and the output voltage of the operational amplifier after correction has temperature-dependent characteristics and fluctuates according to temperature change. On the other hand, in above Japanese Laid-open Patent Publication No. 5-291845, the temperature characteristic of the offset voltage is compensated for, but there is no description about a technology to reduce (correct) the offset voltage itself.

The present embodiment is made in consideration of this point and provides an offset correction circuit and a transconductance proportional current generation circuit that can correct the offset voltage with high accuracy by reducing temperature drift.

Figure 4:
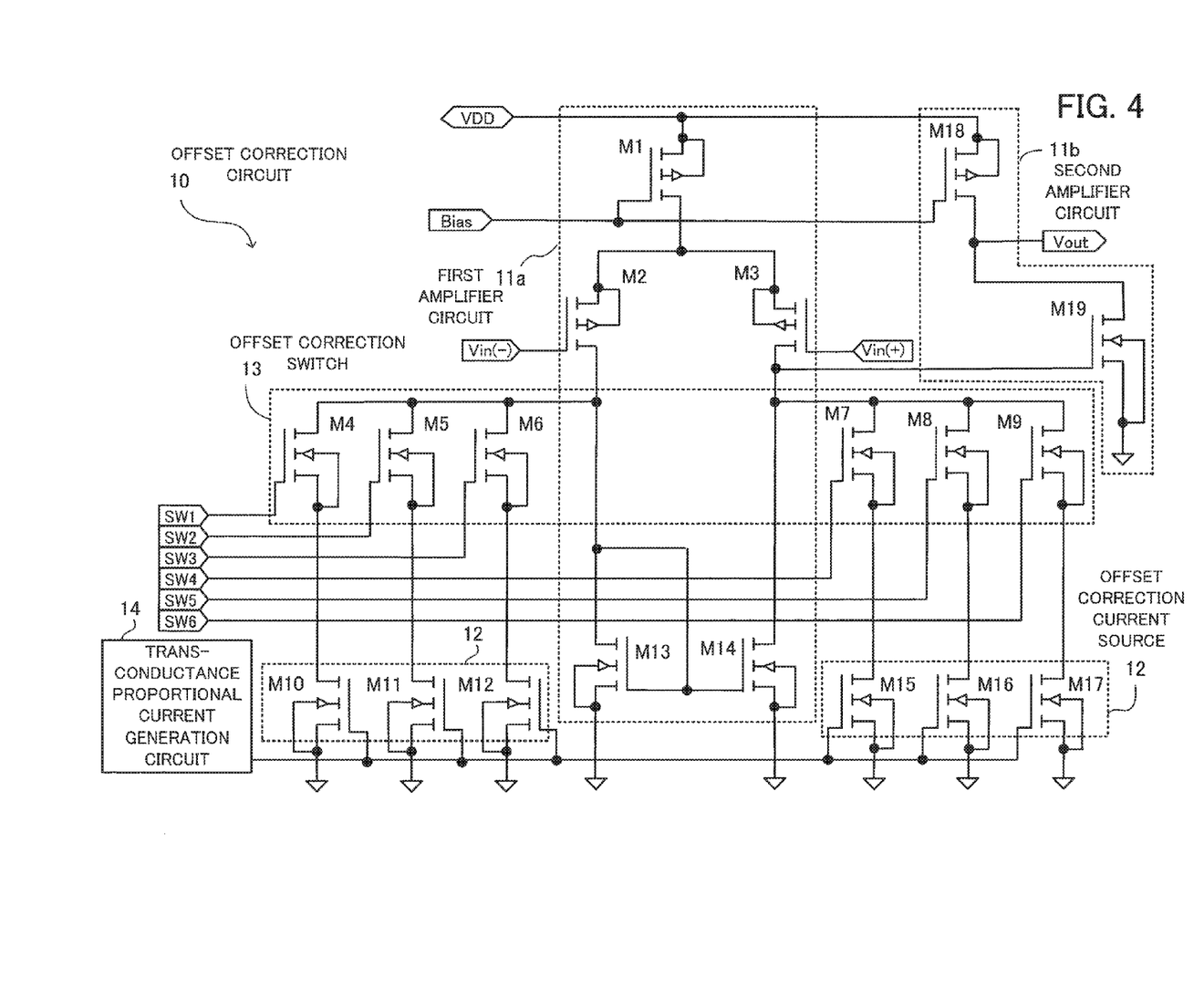
FIG. 4 illustrates one example of a configuration of an offset correction circuit of the present embodiment.

Next, an offset correction circuit that employs the technology of the present embodiment will be described. FIG. 4 illustrates one example of a configuration of the offset correction circuit of the present embodiment. The offset correction circuit 10 includes a first amplifier circuit 11a and a second amplifier circuit 11b that make up an operational amplifier circuit, an offset correction current source 12, an offset correction switch 13, and a transconductance proportional current generation circuit 14.

The first amplifier circuit 11a is a differential amplifier circuit of input stage. The first amplifier circuit 11a includes differential pair PMOS transistors M2 and M3 that amplify a difference between input voltages, a PMOS transistor M1 which is a current source for the PMOS transistors M2 and M3, and active load NMOS transistors M13 and M14 connected to the PMOS transistors M2 and M3.

The second amplifier circuit 11b is a grounded source circuit of output stage and includes an active load PMOS transistor M18 and an amplification NMOS transistor M19.

The offset correction switch 13 includes NMOS transistors M4 to M9, and the offset correction current source 12 includes NMOS transistors M10 to M12 and M15 to M17 as current sources.

In the connection relationship of the circuit elements, a power supply terminal VDD is connected to a source of the PMOS transistor M1 and a source of the PMOS transistor M18. A bias terminal Bias is connected to a gate of the PMOS transistor M1 and a gate of the PMOS transistor M18.

A drain of the PMOS transistor M1 is connected to a source of the PMOS transistor M2 and a source of the PMOS transistor M3. An input terminal Vin(−) is connected to a gate of the PMOS transistor M2, and an input terminal Vin(+) is connected to a gate of the PMOS transistor M3.

An output terminal Vout is connected to a drain of the PMOS transistor M18 and a drain of the NMOS transistor M19, and a source of the NMOS transistor M19 is connected to a GND.

A drain of the PMOS transistor M2 is connected to a drain of the NMOS transistor M13, a gate of the NMOS transistor M13, a gate of the NMOS transistor M14, and respective drains of the NMOS transistors M4 to M6.

A drain of the PMOS transistor M3 is connected to a drain of the NMOS transistor M14, a gate of the NMOS transistor M19, and respective drains of the NMOS transistors M7 to M9. Sources of the transistors M13 and M14 are connected to the GND.

A drain of the NMOS transistor M10 is connected to a source of the NMOS transistor M4, and a drain of the NMOS transistor M11 is connected to a source of the NMOS transistor M5, and a drain of the NMOS transistor M12 is connected to a source of the NMOS transistor M6.

A drain of the NMOS transistor M15 is connected to a source of the NMOS transistor M7, and a drain of the NMOS transistor M16 is connected to a source of the NMOS transistor M8, and a drain of the NMOS transistor M17 is connected to a source of the NMOS transistor M9.

Switch terminals SW1 to SW3 are connected to gates of the NMOS transistors M4 to M6 respectively, and switch terminals SW4 to SW6 are connected to gates of the NMOS transistors M7 to M9 respectively.

Gates of the NMOS transistors M10 to M12 and M15 to M17 are connected to an output terminal of the transconductance proportional current generation circuit 14, and sources of the NMOS transistors M10 to M12 and M15 to M17 are connected to the GND. Note that current source selection operation by switching is the same as FIG. 3, and thus its description will be omitted.

Figure 5:
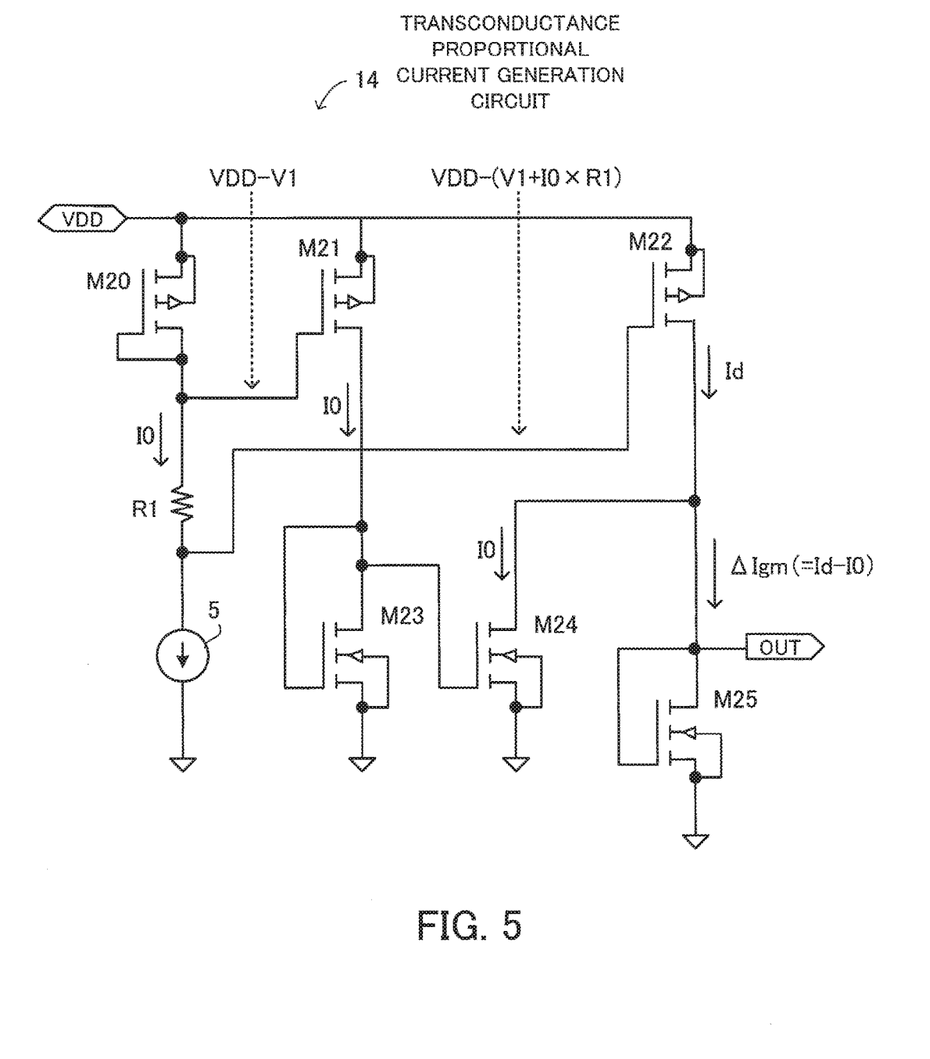
FIG. 5 illustrates one example of a configuration of a transconductance proportional current generation circuit.

Next, the transconductance proportional current generation circuit 14 will be described in detail. FIG. 5 illustrates one example of a configuration of the transconductance proportional current generation circuit. The transconductance proportional current generation circuit 14 includes PMOS transistors M20 to M22, NMOS transistors M23 to M25, a resistor R1, and a current source 5.

Note that the PMOS transistors M20 to M22 have the same characteristics. Also, the NMOS transistors M23 and M24 have the same characteristics. Further, the NMOS transistor M25 has the same characteristics as the NMOS transistors M10 to M12 and M15 to M17 of the offset correction current source 12. Note that the same characteristics mean the same size, for example.

Note that in this example a differential pair is composed of PMOS transistors, and thus the configuration is as illustrated in FIG. 5, but when the differential pair is composed of NMOS transistors, the same functionality is achieved by changing each MOS transistor to opposite type.

Here, the current source 5 flows a first electric current (electric current I0) whose current value is stable in relation to temperature. The resistor R1 is a resistive element whose resistance value is stable in relation to temperature. The PMOS transistor M20 (first PMOS transistor) has a gate and a drain connected to the resistor R1, and the electric current I0 flows through the PMOS transistor M20.

The PMOS transistor M21 (second PMOS transistor) has a common gate with the PMOS transistor M20, and the electric current I0 flows through the PMOS transistor M21. The NMOS transistor M23 (first NMOS transistor) has a gate and a drain connected to a drain of the PMOS transistor M21 and a source that is grounded.

The NMOS transistor M24 (second NMOS transistor) has a common gate with the NMOS transistor M23 and a source that is grounded, and the electric current I0 flows through the NMOS transistor M24.

The PMOS transistor M22 (third PMOS transistor) has a gate which receives voltage that is lower than the gate voltage of the PMOS transistor M20 by the dropping voltage of the resistor R1, and a second electric current (electric current Id) flows through the PMOS transistor M22. The NMOS transistor M25 (third NMOS transistor) is diode-connected, and transconductance proportional current ΔIgm obtained by subtracting the electric current I0 from the electric current Id flows through the NMOS transistor M25.

In the connection relationship of the circuit elements, a source of the PMOS transistor M20 is connected to a power supply terminal VDD, a source of the PMOS transistor M21, and a source of the PMOS transistor M22.

The gate of the PMOS transistor M20 is connected to the drain of the PMOS transistor M20, the gate of the PMOS transistor M21, and one end of the resistor R1. Another end of the resistor R1 is connected to an input terminal of the current source 5 and the gate of the PMOS transistor M22.

The drain of the PMOS transistor M21 is connected to the drain of the NMOS transistor M23, the gate of the NMOS transistor M23, and the gate of the NMOS transistor M24.

A drain of the PMOS transistor M22 is connected to a drain of the NMOS transistor M24, a drain of the NMOS transistor M25, a gate of the NMOS transistor M25, and an output terminal OUT. An output terminal of the current source 5 and sources of the NMOS transistors M23 to M25 are connected to the GND.

Note that the output terminal OUT is connected to the gates of the NMOS transistors M10 to M12 and M15 to M17 (which correspond to a device having a common gate with the NMOS transistor M25) illustrated in FIG. 4.

Here, the PMOS transistor M20 is diode-connected and is connected to the current source 5 via the resistor R1. The resistor R1 has temperature-independent flat temperature characteristics, and the current source 5 also has flat temperature characteristics (such a resistor and a current source having flat temperature characteristics will be described later).

The PMOS transistor M20 is diode-connected, and therefore the electric current I0 flowing through the current source 5 flows through the PMOS transistor M20, and the electric current I0 also flows through the PMOS transistor M21 having a common gate.

Moreover, the NMOS transistor M23 is also diode-connected, and therefore the electric current I0 also flows through the NMOS transistor M23, and the electric current I0 also flows through the NMOS transistor M24 having a common gate with the NMOS transistor M23.

When the gate-source voltages of the PMOS transistors M20 and M21 are V1, the gate voltages of the PMOS transistors M20 and M21 are VDD−V1. Also, the gate voltage of the PMOS transistor M22 is VDD−(V1+I0×R1), which is lower than the voltage (VDD−V1) by the dropping voltage of the resistor R1.

The gate voltage of the PMOS transistor M22 is lower than the gate voltages (VDD−V1) of the PMOS transistors M20 and M21 by (I0×R1).

Thus, when the transconductance of the PMOS transistor M22 is gm2, the electric current flowing through the PMOS transistor M22 increases from the electric current I0 by gm2×I0×R1. That is, the electric current Id flowing through the PMOS transistor M22 is Id=I0+gm2×I0×R1.

Also, the electric current I0 flows into the NMOS transistor M24, and thus remaining current (gm2×I0×R1) flows through the NMOS transistor M25. Thus, the electric current ΔIgm flowing through the NMOS transistor M25 is expressed by ΔIgm=(gm2×I0×R1).

Then, the electric current ΔIgm=(gm2×I0×R1) flowing through the NMOS transistor M25 is used as the electric current parameter ΔI of the calculation equation (9) of the offset correction voltage ΔVo. In this case, the offset correction voltage ΔVo is expressed by following equation (11).

$$\Delta Vo = \frac{\Delta I}{gmd} \qquad (11)$$

$$= \frac{gm2 \cdot I0 \cdot R1}{gmd}$$

$$= \frac{\sqrt{2 \cdot \mu \cdot Cox2 \cdot \frac{W_2}{L_2} \cdot I0} \cdot I0 \cdot R1}{\sqrt{2 \cdot \mu \cdot Coxd \cdot \frac{W_d}{L_d} \cdot I}}$$

$$= \frac{\sqrt{Cox2 \cdot \frac{W_2}{L_2} \cdot I0} \cdot I0 \cdot R1}{\sqrt{Coxd \cdot \frac{W_d}{L_d} \cdot I}}$$

Note that, in equation (11), gm2 is the transconductance of the PMOS transistor M22 of FIG. 5; gmd is the transconductances of the PMOS transistors M2 and M3 of FIG. 4; Cox2 is the gate oxide film capacitance per unit area of the PMOS transistor M22; and Coxd is the gate oxide film capacitances per unit area of the PMOS transistors M2 and M3.

Also, $W_2$ is the gate width of the PMOS transistor M22; $W_d$ is the gate widths of the PMOS transistors M2 and M3; and $L_2$ is the gate length of the PMOS transistor M22; and $L_d$ is the gate lengths of the PMOS transistors M2 and M3.

As in equation (11), the parameter of mobility p, which caused the temperature-dependent characteristics of the offset correction voltage ΔVo, is removed. Thus, when the temperature characteristics of the parameters I, I0, and R1 are flat, the temperature characteristics of ΔVo are also flat. Thereby, the offset correction voltage ΔVo having flat temperature characteristics is obtained.

For example, a low temperature coefficient (LTC) resistive element, which is a low temperature coefficient resistor called an LTC resistor, can be used as the resistor R1 having flat temperature characteristics.

The LTC resistor uses polysilicon as a resistor by forming polysilicon, which is generally utilized as gate electrodes of MOSFETs, in a region other than a gate oxide film. Note that the resistance is made higher by inserting impurities into the polysilicon as appropriate.

Figure 6:
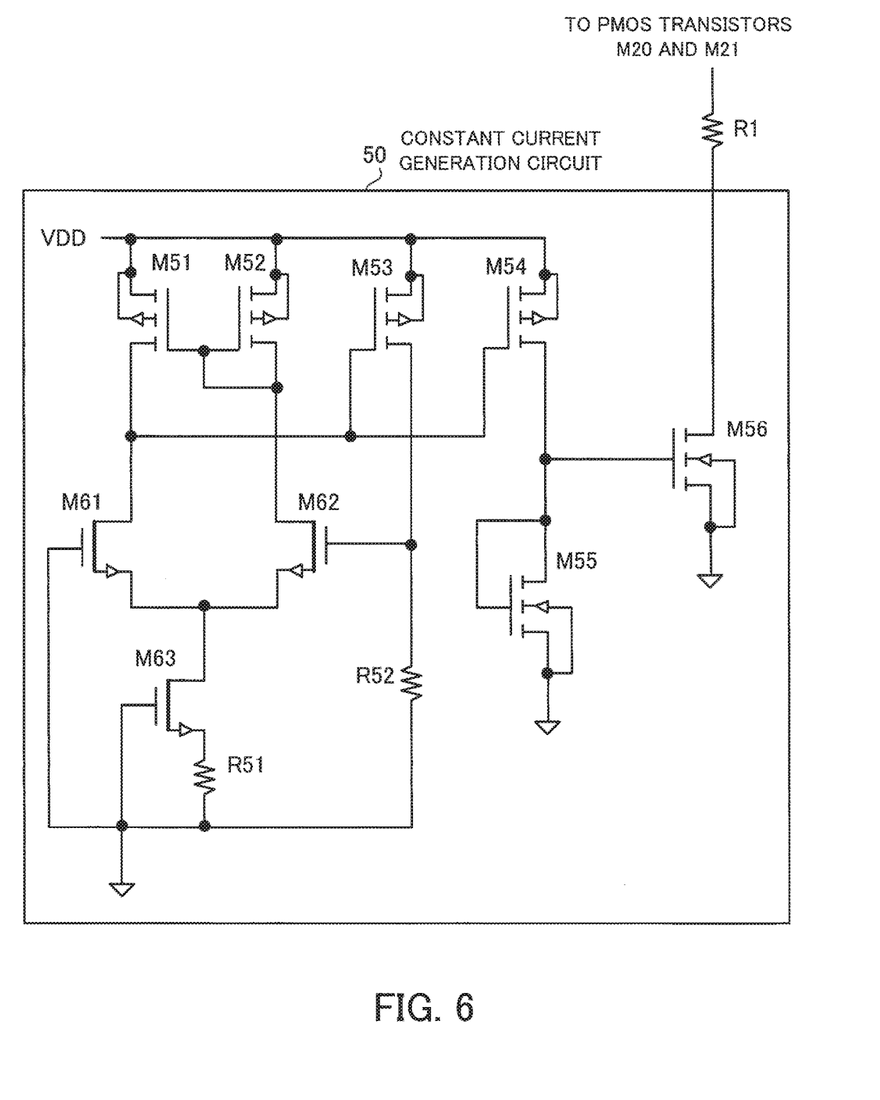
FIG. 6 illustrates one example of a configuration of a constant current generation circuit having flat temperature characteristics.

Also, a circuit illustrated in FIG. 6 can be employed as the current source 5 having flat temperature characteristics, for example. FIG. 6 illustrates one example of a configuration of the constant current generation circuit having flat temperature characteristics.

The constant current generation circuit 50 includes PMOS transistors M51 to M54, NMOS transistors M55 and M56, depletion NMOS transistors M61 to M63, and resistors R51 and R52.

In the connection relationship of the circuit elements, a source of the PMOS transistor M51 is connected to a power supply VDD and sources of the PMOS transistors M52 to M54. A gate of the PMOS transistor M51 is connected to a gate of the PMOS transistor M52, a drain of the PMOS transistor M52, and a drain of the NMOS transistor M62.

A drain of the PMOS transistor M51 is connected to a drain of the NMOS transistor M61, a gate of the PMOS transistor M53, and a gate of the PMOS transistor M54.

A source of the NMOS transistor M61 is connected to a source of the NMOS transistor M62 and a drain of the NMOS transistor M63, and a source of the NMOS transistor M63 is connected to one end of the resistor R51.

A drain of the PMOS transistor M53 is connected to a gate of the NMOS transistor M62 and one end of the resistor R52. A drain of the PMOS transistor M54 is connected to a drain of the NMOS transistor M55, a gate of the NMOS transistor M55, and a gate of the NMOS transistor M56, and a drain of the NMOS transistor M56 is connected to one end of the resistor R1 illustrated in FIG. 5. Gates of the NMOS transistors M61 and M63, other ends of the resistors R51 and R52, and sources of the NMOS transistors M55 and M56 are connected to the GND.

The above constant current generation circuit 50 outputs electric current having flat temperature characteristics, by means of gate-source voltages of the depletion NMOS transistors M61 and M62 and the resistor R52.

Next, weighting of the offset correction current source I2 will be described. In the offset correction circuit 10 illustrated in FIG. 4, switching is performed to select the NMOS transistor of the current source in order to flow predetermined electric current, as described above. In this case, weighting of electric current amount is performed for the respective current sources, so that the electric current amount to flow is set in a variable manner.

For example, when the rate of currents flowing from the NMOS transistors M15 to M17 is weighted as 1:2:4, the size rate of the NMOS transistors M15 to M17 is set to 1:2:4. Thereby, the electric current amount is weighted to set the electric current amount to flow in a variable manner.

Figure 7:
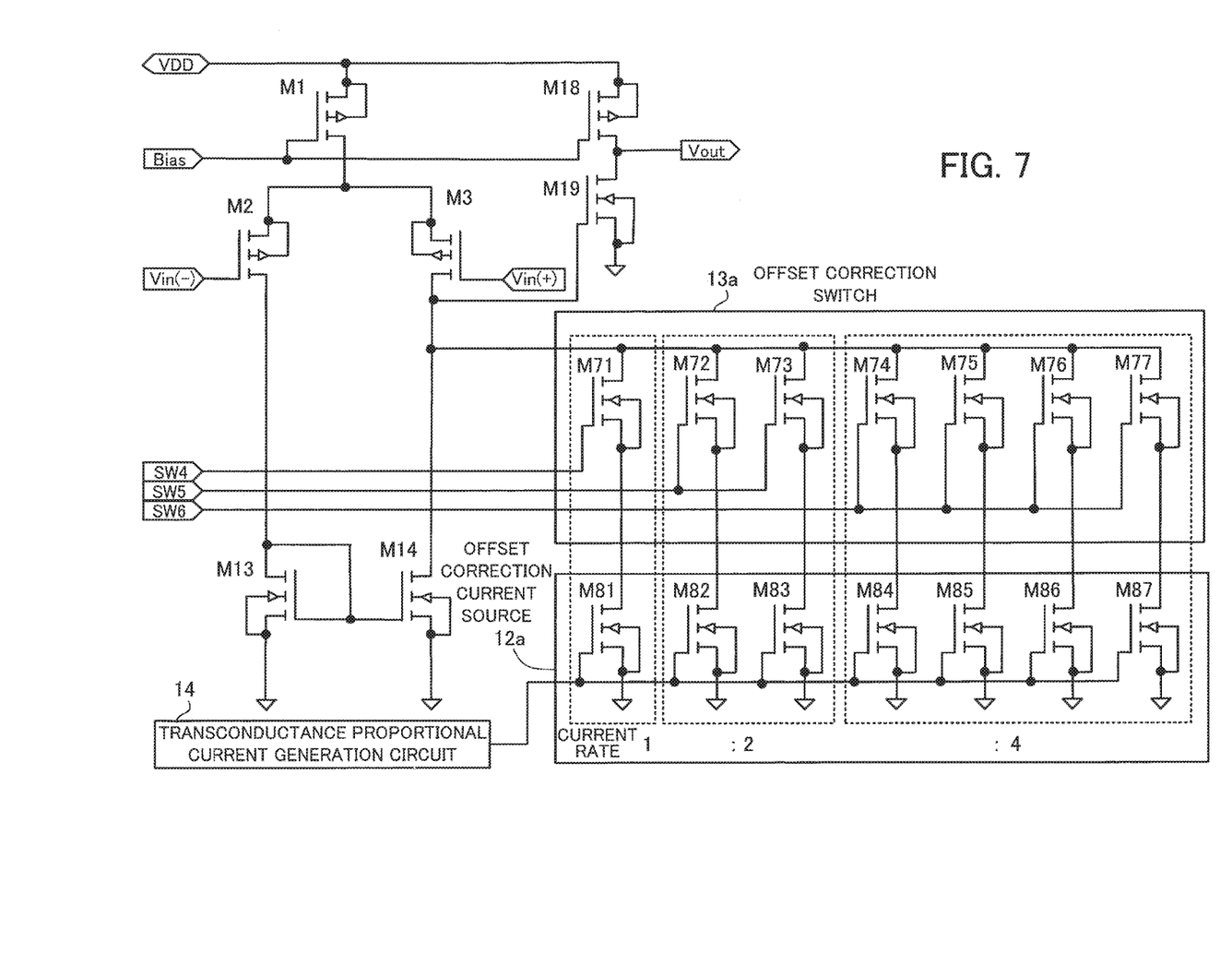
FIG. 7 illustrates one example of a configuration of an offset correction current source in which electric current amounts are weighted.

Alternatively, when weighting of electric current amount is performed by using transistors of the same sizes, the circuit is configured as illustrated in FIG. 7, for example.

FIG. 7 illustrates one example of a configuration of the offset correction current source in which electric current amounts are weighted. FIG. 7 illustrates a circuit configuration in which the rate of currents flowing from the current sources positioned at the right side of the NMOS transistors M13 and M14 is weighted as 1:2:4.

Note that the current sources of the left side of the active loads have the same configuration as the current sources of the right side, and therefore FIG. 7 illustrates only an example of weighting the current sources positioned at the right side of the active load NMOS transistors M13 and M14.

An offset correction switch 13a includes NMOS transistors M71 to M77, and an offset correction current source 12a includes NMOS transistors M81 to M87.

Here, a current source weighted as 1 by switching control is made up of the NMOS transistors M71 and M81. Also, a current source weighted as 2 by switching control is made up of the NMOS transistors M72, M73, M82, and M83. Further, a current source weighted as 4 by switching control is made up of the NMOS transistors M74 to M77 and M84 to M87.

The connection relationship of the circuit elements in the offset correction switch 13a and the offset correction current source 12a will be described (other connection relationship has been described above, and thus its description will be omitted). A drain of the NMOS transistor M71 is connected to drains of the NMOS transistors M72 to M77, the drain of the PMOS transistor M3, the gate of the NMOS transistor M19, and the drain of the NMOS transistor M14.

The switch terminal SW4 is connected to a gate of the NMOS transistor M71, and the switch terminal SW5 is connected to gates of the NMOS transistors M72 and M73, and the switch terminal SW6 is connected to gates of the NMOS transistor M74 to M77.

A source of the NMOS transistor M71 is connected to a drain of the NMOS transistor M81, and a source of the NMOS transistor M72 is connected to a drain of the NMOS transistor M82, and a source of the NMOS transistor M73 is connected to a drain of the NMOS transistor M83.

A source of the NMOS transistor M74 is connected to a drain of the NMOS transistor M84, and a source of the NMOS transistor M75 is connected to a drain of the NMOS transistor M85. A source of the NMOS transistor M76 is connected to a drain of the NMOS transistor M86, and a source of the NMOS transistor M77 is connected to a drain of the NMOS transistor M87.

Gates of the NMOS transistors M81 to M87 are connected to the output terminal of the transconductance proportional current generation circuit 14, and Sources of the NMOS transistors M81 to M87 are connected to the GND.

With the above configuration, the offset voltage is corrected with the offset-voltage-correction current rate weighted as 1:2:4.

Figure 8:
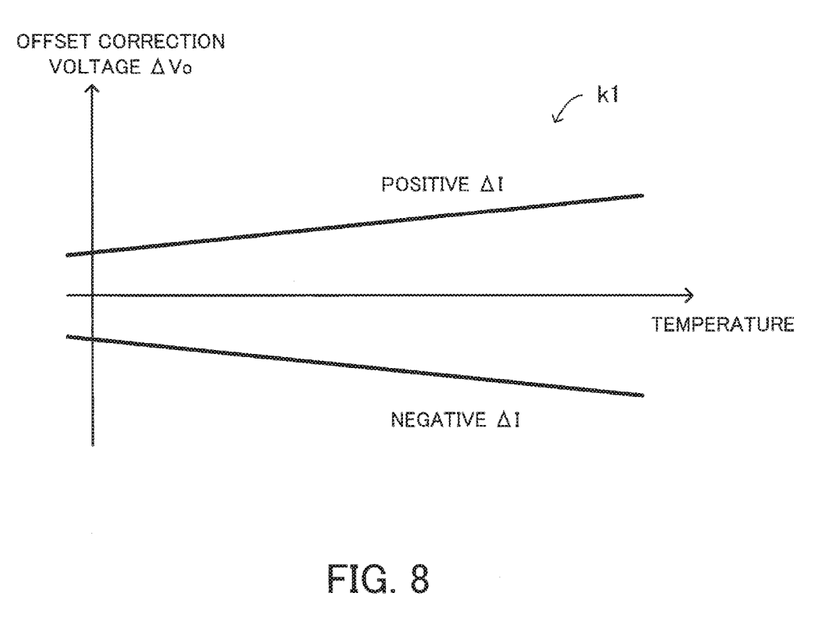
FIG. 8 illustrates a relationship between offset correction voltage and temperature.
Figure 9:
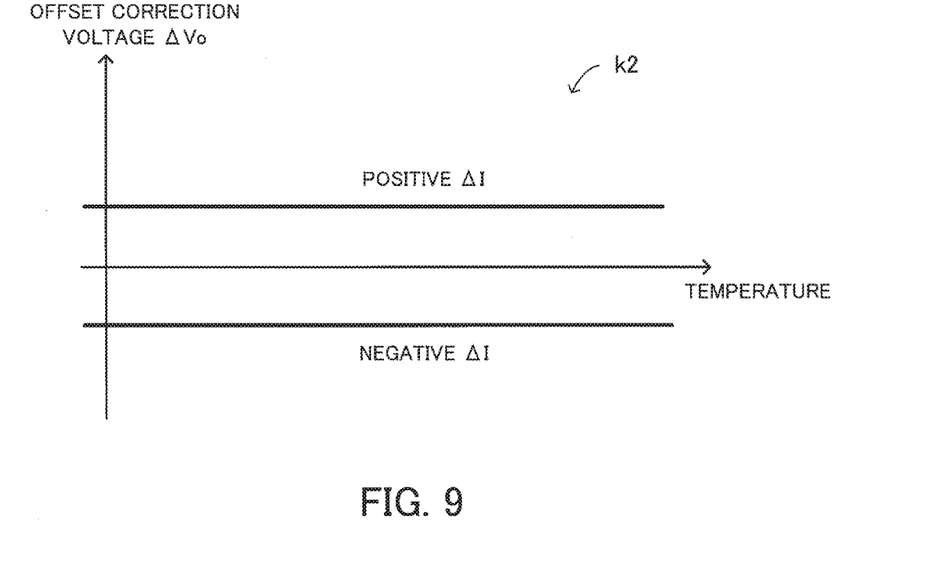
FIG. 9 illustrates a relationship between offset correction voltage and temperature.

Next, an effect of the present embodiment will be described. FIGS. 8 and 9 illustrate a relationship between offset correction voltage and temperature. The vertical axis represents offset correction voltage $\Delta Vo$, and the horizontal axis represents temperature. The graph k1 of FIG. 8 illustrates a case of the offset correction circuit 100 illustrated in FIG. 3, and the graph k2 of FIG. 9 illustrates a case of the offset correction circuit 10 of the present embodiment illustrated in FIG. 4.

In the offset correction circuit 100, the offset correction voltage $\Delta Vo$ includes the parameter of mobility $\mu$ as in equation (9). The mobility has negative temperature characteristics, and thus the offset correction voltage $\Delta Vo$ increases when the electric current $\Delta I$ of the offset correction current source is positive, and the offset correction voltage $\Delta Vo$ decreases when the electric current $\Delta I$ of the offset correction current source is negative, as illustrated in the graph k1. That is, the absolute value of the offset correction voltage $\Delta Vo$ increases with temperature.

In contrast, in the offset correction circuit 10 of the present embodiment, the offset correction voltage $\Delta Vo$ does not include the parameter of mobility $\mu$ as in equation (11). Hence, as illustrated in the graph k2, the offset correction voltage $\Delta Vo$ does not change but becomes flat as temperature changes, regardless of whether the electric current $\Delta I$ of the offset correction current source is positive or negative.

Figure 10:
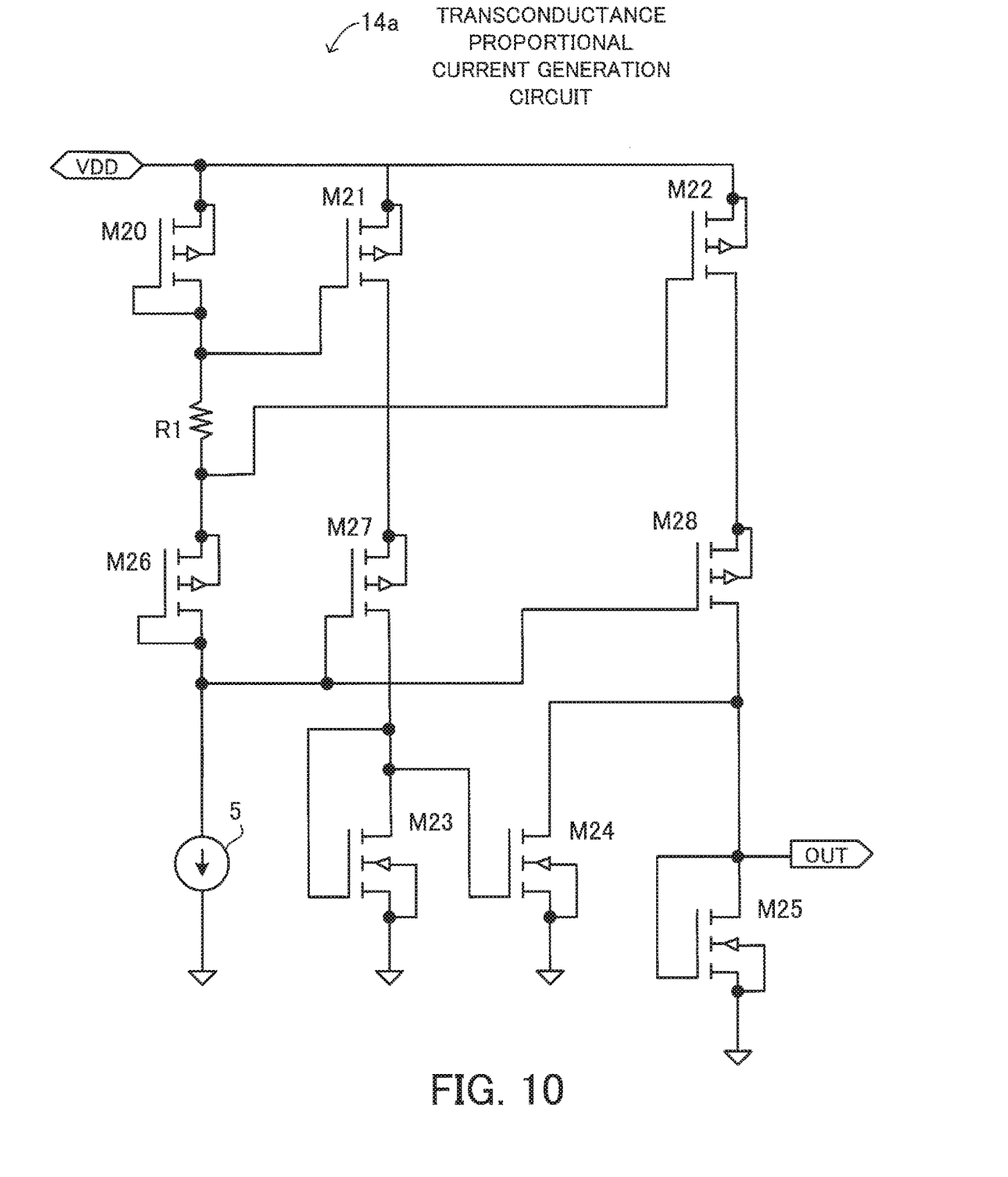
FIG. 10 illustrates another example of a configuration of a transconductance proportional current generation circuit.

Next, one example of a variant of the transconductance proportional current generation circuit will be described. FIG. 10 illustrates another exemplary configuration of the transconductance proportional current generation circuit. The transconductance proportional current generation circuit 14a illustrated in FIG. 10 is configured such that PMOS transistors M26 (sixth PMOS transistor), M27 (fourth PMOS transistor), and M28 (fifth PMOS transistor) are added as cascode transistors. Difference from FIG. 5 is addition of the PMOS transistors M26 to M28.

In the connection relationship of the circuit elements around the PMOS transistors M26 to M28, a source of the PMOS transistor M26 is connected to the other end of the resistor R1 and the gate of the PMOS transistor M22. A gate of the PMOS transistor M26 is connected to a drain of the PMOS transistor M26, the input terminal of the current source 5, and gates of the PMOS transistors M27 and M28.

A source of the PMOS transistor M27 is connected to the drain of the PMOS transistor M21. A drain of the PMOS transistor M27 is connected to the drain of the NMOS transistor M23, the gate of the NMOS transistor M23, and the gate of the NMOS transistor M24.

A source of the PMOS transistor M28 is connected to the drain of the PMOS transistor M22, and a drain of the PMOS transistor M28 is connected to the drain of the NMOS transistor M24, the drain of the NMOS transistor M25, the gate of the NMOS transistor M25, and the output terminal OUT.

Note that the PMOS transistors M26 to M28 have the same characteristics. Note that the same characteristics mean the same size, for example.

Here, the three PMOS transistors M26, M27, and M28 have a common gate and operates to set the source potential of the PMOS transistor M26 at the same level as the source potentials of the PMOS transistors M27 and M28. Thus, the drain potentials of the PMOS transistors M20, M21, and M22 become the same level, and the drain-source voltages of the PMOS transistors M20, M21, and M22 become the same value. This prevents generation of electric current imbalance due to channel length modulation effect between the PMOS transistors M20, M21, and M22.

As described above, the offset correction circuit of the present embodiment is configured not to include the parameter of mobility which has negative temperature characteristics. Thereby, temperature drift is reduced to correct the offset voltage with high accuracy. Also, the present embodiment is also applicable to a folded cascode operational amplifier, for example.

According to one aspect, temperature drift is reduced to correct the offset voltage with high accuracy.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An offset correction circuit comprising:
    an operational amplifier circuit that includes a first amplifier circuit that includes differential pair transistors for amplifying a difference between input voltages and active load transistors connected to the differential pair transistors, and a second amplifier circuit that amplifies an output voltage of the first amplifier circuit;
    an offset correction current source that is connected in parallel with the active load transistors and adjusts electric current flowing through the differential pair transistors to correct offset voltage;
    an offset correction switch that switches a driving state of the offset correction current source; and
    a transconductance proportional current generation circuit that generates a transconductance proportional current for compensating for temperature drift of an offset correction voltage for correcting the offset voltage, the transconductance proportional current being proportional to a transconductance of one or more transistors in the transconductance proportional current generation circuit.

2. The offset correction circuit according to claim 1, wherein
    the transconductance proportional current generation circuit includes:
    a current source that flows first electric current whose current value is stable in relation to temperature;
    a resistor whose resistance value is stable in relation to temperature;
    a first PMOS transistor that includes a gate and a drain connected to the resistor, wherein the first electric current flows through the first PMOS transistor;
    a second PMOS transistor that includes a common gate with the first PMOS transistor, wherein the first electric current flows through the second PMOS transistor;
    a first NMOS transistor that includes a gate and a drain connected to a drain of the second PMOS transistor and a source that is grounded;
    a second NMOS transistor that includes a common gate with the first NMOS transistor and a source that is grounded, wherein the first electric current flows through the second NMOS transistor;
    a third PMOS transistor that includes a gate that receives voltage that is lower than gate voltage of the first PMOS transistor by dropping voltage of the resistor, wherein second electric current flows through the third PMOS transistor; and
    a third NMOS transistor that is diode-connected, wherein the first electric current in the second electric current flows through the second NMOS transistor, and the transconductance proportional current obtained by subtracting the first electric current from the second electric current flows through the third NMOS transistor,
    wherein the transconductance proportional current is proportional to a transconductance of the third PMOS transistor and flows through a device including a common gate with the third NMOS transistor.

3. The offset correction circuit according to claim 2, wherein
    a source of the first PMOS transistor is connected to a power supply, a source of the second PMOS transistor, and a source of the third PMOS transistor,
    the gate of the first PMOS transistor is connected to the drain of the first PMOS transistor, the gate of the second PMOS transistor, and one end of the resistor,
    another end of the resistor is connected to an input terminal of the current source and the gate of the third PMOS transistor,
    the drain of the second PMOS transistor is connected to the drain of the first NMOS transistor, the gate of the first NMOS transistor, and the gate of the second NMOS transistor,
    a drain of the third PMOS transistor is connected to a drain of the second NMOS transistor, a drain of the third NMOS transistor, a gate of the third NMOS transistor, and an output terminal of the transconductance proportional current generation circuit, and an output terminal of the current source and sources of the first, second, and third NMOS transistors are connected to a ground.

4. The offset correction circuit according to claim 1, wherein the offset correction current source includes a plurality of current sources whose electric current amounts are weighted, and variably sets electric current to flow by switching of the offset correction switch.

5. The offset correction circuit according to claim 2, further comprising:

a fourth PMOS transistor that is provided between the drain of the second PMOS transistor and the gate and the drain of the first NMOS transistor and includes a source connected to the drain of the second PMOS transistor and a drain connected to the gate and the drain of the first NMOS transistor, wherein the first electric current flows through the fourth PMOS transistor;

a fifth PMOS transistor that includes a source connected to a drain of the third PMOS transistor and a gate connected to a gate of the fourth PMOS transistor, wherein the second electric current flows through the fifth PMOS transistor; and a sixth PMOS transistor that includes a source connected to the gate of the third PMOS transistor and a gate and a drain connected to the gate of the fourth PMOS transistor, wherein the first electric current flows through the sixth PMOS transistor.

6. A transconductance proportional current generation circuit for generating electric current proportional to transconductance, comprising:

a current source that flows first electric current whose current value is stable in relation to temperature;

a resistor whose resistance value is stable in relation to temperature;

a first PMOS transistor that includes a gate and a drain connected to the resistor, wherein the first electric current flows through the first PMOS transistor;

a second PMOS transistor that includes a common gate with the first PMOS transistor, wherein the first electric current flows through the second PMOS transistor;

a first NMOS transistor that includes a gate and a drain connected to a drain of the second PMOS transistor and a source that is grounded;

a second NMOS transistor that includes a common gate with the first NMOS transistor and a source that is grounded, wherein the first electric current flows through the second NMOS transistor;

a third PMOS transistor that includes a gate that receives voltage that is lower than gate voltage of the first PMOS transistor by dropping voltage of the resistor, wherein second electric current flows through the third PMOS transistor; and a third NMOS transistor that is diode-connected, wherein transconductance proportional current obtained by subtracting the first electric current from the second electric current flows through the third NMOS transistor, wherein the transconductance proportional current proportional to transconductance of the third PMOS transistor flows through a device including a common gate with the third NMOS transistor.

7. The transconductance proportional current generation circuit according to claim 6, wherein a source of the first PMOS transistor is connected to a power supply, a source of the second PMOS transistor, and a source of the third PMOS transistor, the gate of the first PMOS transistor is connected to the drain of the first PMOS transistor, the gate of the second PMOS transistor, and one end of the resistor, another end of the resistor is connected to an input terminal of the current source and the gate of the third PMOS transistor, the drain of the second PMOS transistor is connected to the drain of the first NMOS transistor, the gate of the first NMOS transistor, and the gate of the second NMOS transistor, a drain of the third PMOS transistor is connected to a drain of the second NMOS transistor, a drain of the third NMOS transistor, a gate of the third NMOS transistor, and an output terminal of the transconductance proportional current generation circuit, and an output terminal of the current source and sources of the first, second, and third NMOS transistors are connected to a ground.

8. The transconductance proportional current generation circuit according to claim 6, further comprising:

a fourth PMOS transistor that is provided between the drain of the second PMOS transistor and the gate and the drain of the first NMOS transistor and includes a source connected to the drain of the second PMOS transistor and a drain connected to the gate and the drain of the first NMOS transistor, wherein the first electric current flows through the fourth PMOS transistor;

a fifth PMOS transistor that includes a source connected to a drain of the third PMOS transistor and a gate connected to a gate of the fourth PMOS transistor, wherein the second electric current flows through the fifth PMOS transistor; and a sixth PMOS transistor that includes a source connected to the gate of the third PMOS transistor and a gate and a drain connected to the gate of the fourth PMOS transistor, wherein the first electric current flows through the sixth PMOS transistor.

* * * * *